United States Patent
Iwai et al.

(10) Patent No.: US 6,691,911 B2
(45) Date of Patent: Feb. 17, 2004

(54) METHOD FOR HERMETIC SEALING OF ELECTRONIC PARTS

(75) Inventors: Shozaburo Iwai, Kanagawa (JP); Masaru Kobayashi, Kanagawa (JP); Osamu Sawada, Kanagawa (JP)

(73) Assignee: Tanaka Kikinzoku Kogky K.K., Tokyo (JP)

( * ) Notice: Subject to any disclaimer, the term of this patent is extended or adjusted under 35 U.S.C. 154(b) by 0 days.

(21) Appl. No.: 10/149,746

(22) PCT Filed: Nov. 27, 2001

(86) PCT No.: PCT/JP01/10302
§ 371 (c)(1),
(2), (4) Date: Jun. 13, 2002

(87) PCT Pub. No.: WO02/43141
PCT Pub. Date: May 30, 2002

(65) Prior Publication Data
US 2002/0190106 A1 Dec. 19, 2002

(30) Foreign Application Priority Data
Nov. 27, 2000 (JP) .......................... 2000-358744

(51) Int. Cl.$^7$ .......................... B23K 31/02; B23K 35/12
(52) U.S. Cl. ............... 228/124.6; 228/245; 438/106
(58) Field of Search ............... 228/124.6, 245–248.1; 438/106–127; 75/228, 245

(56) References Cited

U.S. PATENT DOCUMENTS

| | | | | |
|---|---|---|---|---|
| 3,648,357 A | * | 3/1972 | Green, Jr. ................... 228/186 |
| 4,356,047 A | * | 10/1982 | Gordon et al. ............... 427/123 |
| 4,418,857 A | * | 12/1983 | Ainslie et al. ............ 228/124.1 |
| 4,772,935 A | * | 9/1988 | Lawler et al. ............... 257/751 |
| 4,833,102 A | * | 5/1989 | Byrne et al. ................. 228/121 |
| 4,995,546 A | * | 2/1991 | Regnault .................. 228/123.1 |
| 5,622,305 A | * | 4/1997 | Bacon et al. ............. 228/123.1 |
| 5,692,298 A | * | 12/1997 | Goetz et al. ................... 29/848 |
| 6,203,929 B1 | * | 3/2001 | Muller ........................ 428/643 |
| 6,206,269 B1 | * | 3/2001 | Olofsson ................. 228/123.1 |

FOREIGN PATENT DOCUMENTS

JP 3086086 7/2000

OTHER PUBLICATIONS

Rao R. Tummala et al., BP, 1991. 03. 27, 10–9(a) (b) 11–16, p. 589.

* cited by examiner

Primary Examiner—Tom Dunn
Assistant Examiner—Colleen P. Cooke
(74) Attorney, Agent, or Firm—Rothwell Figg Ernst & Manbeck

(57) ABSTRACT

There is provided a method of hermetically sealing electronic parts, comprising the step of bonding a base having semiconductor devices mounted thereon and a cap together via a solder. The solder is composed, by weight, of 78% or more but less than 79.5% Au, and the balance Sn. It is particularly preferred that the bonding is performed with the use of a solder composition composed, by weight, of 78% or more but 79% or less Au, and the balance Sn as the solder and furthermore through plating the cap with gold.

9 Claims, 4 Drawing Sheets

METHOD FOR HERMETIC SEALING OF ELECTRONIC PARTS

This application is a national stage entry of International Application No. PCT/JP01/10302, filed Nov. 27, 2001 designating the U.S., which claims the benefit of Japanese Application No. 2000–358744, filed Nov. 27, 2001.

TECHNICAL FIELD

The present invention relates to a method of hermetically sealing electronic parts by which a container (base) having semiconductor devices placed thereon and a cap are bonded together via a solder. More particularly, it relates to a method of hermetic sealing that can reduce the leak rate to not more than one tenth of levels under conventional methods.

BACKGROUND ART

In various semiconductor devices, such as SAW filters and quartz-crystal oscillators, if they are kept as they are, there is a fear that due to the oxygen and humidity in the air, their conductive patterns and pads might be corroded, resulting in poor properties. Therefore, in order to completely cut off these semiconductor devices from the outside air, usually they are mounted on electronic apparatus while being hermetically sealed in a metal or ceramic container (package), the interior of which is in a vacuum or is filled with He or $N_2$.

As the hermetic sealing technology of semiconductor devices, the solder sealing method, seam welding method, laser sealing method, etc., are known, and these methods are appropriately used according to the scale of electronic parts to be manufactured, required sealing performance, etc. Among others, the solder sealing method involves soldering a cap to a base on which semiconductor devices are mounted, and sealing the semiconductor devices by covering them. Because it is unnecessary to limit container materials and their thickness unlike the seam welding method and because expensive bonding devices required by the laser sealing method are unnecessary, this solder sealing method has come into widespread use as a method that allows a high-level sealed state to be realized at appropriate cost.

Incidentally, for electronic parts for which the above-described sealed state is required, needless to say, it is necessary that the semiconductor devices in the interior be completely cut off from the outside air and be used without a fear of the generation of leakage. In the manufacturing processes of electronic parts by use of these hermetic sealing techniques, a test called the fine leak test is conducted in order to measure the leak rate of products. This test enables even very minutes leaks of not more than $10^{-6}$ atm/cc·sec to be captured and defective parts that do not meet this standard are rejected to guarantee the reliability of electronic parts.

And even for electronic parts of which such a high sealing property is required, through the use of the solder sealing method it is possible to efficiently manufacture electronic parts at a leak rate (fraction defective) of not more than 0.2%. However, in order to further reduce the cost of electronic parts, it is desirable that this leak rate be capable of further reduced.

On the other hand, due to the continuing requirement for smaller-size electronic apparatus of the recent years, it is required that electronic parts to be mounted on these electronic apparatus be also smaller in size. However, when the size of electronic parts is reduced to meet this requirement, the hermetically sealing the electronic parts becomes difficult. When the requirement for a reduction in the fraction defective is considered in addition to this requirement for small size design, it can be said that also for the solder sealing method, a method with a low rate of poor sealing is sought for more readily.

The invention was made in consideration of a situation as mentioned above, and it is the object of the invention to provide a hermetic sealing technique of electronic parts, which permits hermetic sealing by the solder sealing method at a lower leak rate and more efficiently than with conventional methods, and which does not cause leakage even in the trend toward smaller-size electronic parts in the future.

DISCLOSURE OF THE INVENTION

The present inventors has made intensive investigations to solve the above-described problem and decided to review solder materials used in the conventional solder sealing method. This is because existing equipment can be used without a modification and addition of new equipment is unnecessary if a change is made only in the solder materials.

As the solder materials used in the solder sealing method, Sn—Pb-based solders (Sn-37 wt. % Pb) are mostly used and Au—Sn-based solders (Au-20 wt. % Sn) are sometimes used. The present inventors decided to use Au—Sn-based solders as the basic composition of solder materials. This is based on the conception that Pb, which is an element that presents a danger to the human body, is not a desirable material in view of the safety to workers and the standpoint of environmental conservation of the recent times.

And the inventors considered that in using Au—Sn-based solders (Au-20 wt. % Sn) as solder materials, it is necessary to change their compositions in order to ensure higher-reliability sealing than before. This is because although Au-20 wt. % Sn solders have the advantage that they have no effect of sealing on the bonded portions of semiconductor devices, leakage may sometimes occur, though not frequently, because of their relatively low melting points of about 280° C.

And the inventors closely examined the bonded portions obtained by Au-20 wt. % Sn solders, and found out that the bonded portions obtained by the solder materials basically show an Au—Sn eutectic microstructure with a partial mixture of an Au—Sn alloy phase having a high concentration of Au (hereinafter referred to as an Au rich phase) Because this Au rich phase is a kind of intermetallic compound and is hard, it has a higher melting point than the surrounding Au—Sn eutectic phase. At temperatures below the bonding temperature of a cap, therefore, this Au rich phase does not melt and remains as a hard phase. And because of diverse sizes of this Au rich phase, even if a cap is bonded to a base under uniform pressure, Au rich phases of various sizes adhere to the bonded surfaces of the cap or base, with the result that areas of small solder layer thickness and those of large solder layer thickness are formed, leading to a nonuniform thickness of the solder layer.

This nonuniformity of the solder layer is not a direct cause of leakage. However, when the nonuniformity of the solder layer is remarkable, it might be thought that leakage occurs from portions of small solder layer thickness due to the deterioration of the solder layer resulting from use of electronic parts for a long time or due to a pressure difference that occurs in and outside electronic parts during a leak test. Also, it might be thought that when the sizes of electronic parts are reduced in the future, the amount of solder used also decreases and hence the effect of an Au rich phase becomes great. In this case, there is a fear that portions of defective bonding might be formed and that bonded portions whose air-tight state cannot be maintained even immediately after bonding might be formed.

When this effect of an Au rich phase is considered, it is also conceivable that a high temperature at which the Au rich phase can also be melted and at which the solder is a complete liquid phase is used as the bonding temperature of the cap, i.e., the heating temperature of the solder. However, raising the bonding temperature results in an adverse effect on the semiconductor devices in the interior and, therefore, it cannot be said that this is an appropriate means. Therefore, considering that a drastic review of solder compositions is necessary for preventing an Au rich phase from being formed in the melting and solidification processes while keeping the bolding temperature in the same range as before, the inventors conducted an investigation and, as a result, they reached the present invention.

In the invention there is provided a method of hermetically sealing electronic parts that includes the step of bonding a base, on which semiconductor devices are mounted, and a cap together via a solder, in which this solder consists, by weight, of 78% or more but less than 79.5% Au, and the balance Sn.

In the invention, the Au content was slightly changed from those of conventionally used Au—Sn-based solders and by this slight change the microstructure of the solder during solidification can be almost converted to an Au—Sn eutectic structure. As a result, an Au rich phase is not formed in the solder layer during bonding and uniform thickness can be given to the solder layer. As a result, leakage does not occur during use for a long period or during a leak test. As a result, it becomes possible to lower the leak ratio (fraction defective) of bonded portions from conventional levels and to efficiently manufacture electronic parts.

The reason why in the invention the content of Au of the solder to be used is limited to a narrow range of 78 wt. % or more but less than 79.5 wt. % is as follows. Au rich crystals are formed in large amounts when the Au content is not less than 79.5 wt. %, whereas Sn rich crystals begin to be formed when the Au content is less than 78 wt. % and, also in this case, the formation of Sn rich crystals has an adverse effect on bonded portions. Also with the composition of the invention, Sn rich crystals are formed in small amounts. However, because the Sn rich crystals are fine, they do not make the solder layer thickness nonuniform if they are formed in small amounts.

Incidentally, in bonding techniques using solders as in the solder sealing method, it is desirable to improve the wettability of solders in order to ensure the bonding strength of bonded members. In particular, as a material for caps used in electronic parts, Kovar (brand name of a 54 wt. % Fe-29 wt. % Ni-17 wt. % Co alloy) is often used. However, because Kovar is not wetted by solders, bonding defects and solder exfoliation might occur if bonding is performed by directly applying solders to a cap made of Kovar. Therefore, in order to ensure the wettability of solders and a uniform solder layer thickness by preventing the generation of an Au rich phase in solders, it is desirable to perform bonding by plating the cap with gold and by using a solder composition composed, by weight, of 78% or more but 79% or less Au, and the balance Sn, as the solder described in a second aspect of the present invention.

The reason why the cap is plated with gold and why besides the solder composition is made narrower than the range described in claim 1 is that the wettability of the cap is improved by plating the cap with gold and that, at the same time, the formation of an Au rich phase caused by this plating with gold is suppressed. That is, when the cap is plated with gold, the solder and the gold coating layer come into contact with each other and gold is diffused in the solder, resulting in an increase in the gold content of the solder. As a result, an Au rich phase may sometimes be formed. For this reason, by using an Au content of solder in the range, by weight, of 78.5% or more and 79% or less, the Au coming from the coating layer is diffused into an Sn rich phase that is formed in a small amount due to this composition, whereby the microstructure of the solder is formed as an Au—Sn eutectic structure.

Therefore, according to the second aspect of the invention, it is possible to ensure bonding strength by improving the wettability to the cap and, at the same time, it is possible to ensure a uniform solder layer thickness by suppressing the formation of an Au rich phase.

BEST MODE FOR CARRYING OUT THE INVENTION

The embodiment of the invention will be described below in connection with the drawings.

Embodiment

Figure 1:
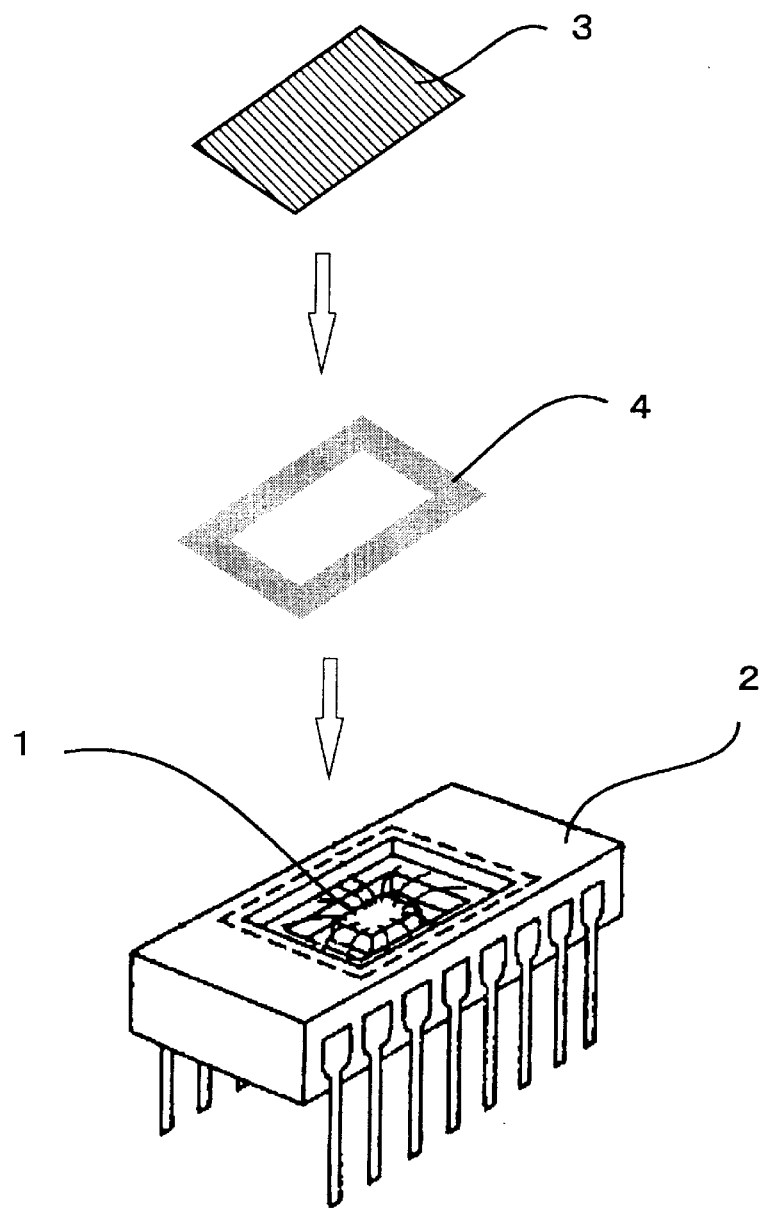
FIG. 1 is a schematic representation of the steps of an IC package fabrication process in this embodiment.
Figure 2:
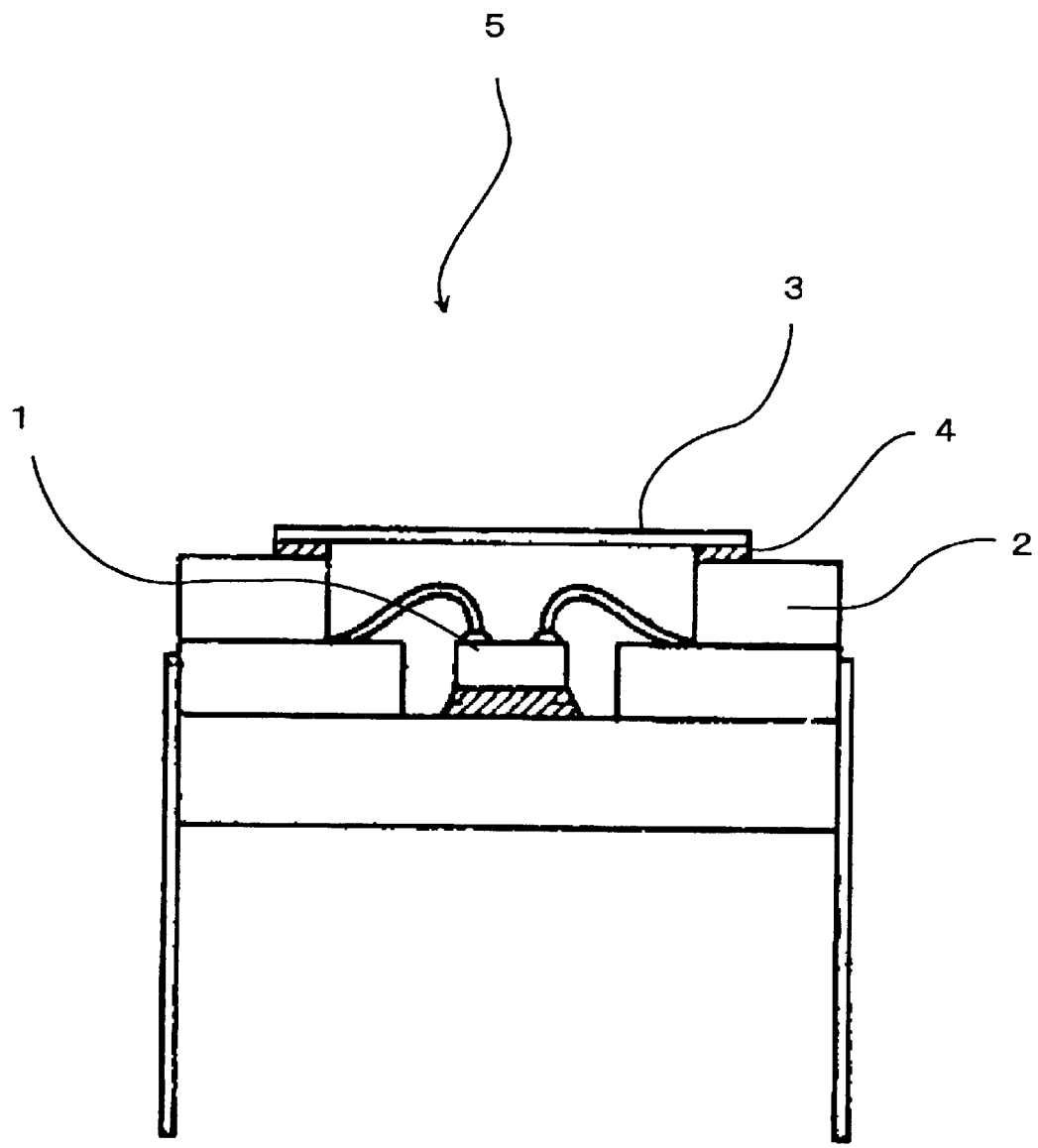
FIG. 2 is a sectional view of an IC package fabricated in this embodiment.

A 78.5 wt. % Au-21.5 wt. % Sn ingot obtained by a melting-casting process was rolled into a sheet and after that, a solder in square ring form was obtained through punching. This solder was employed to bond a cap to a base on which IC chips are mounted, whereby an IC package was produced. As shown in FIG. 1, between a base 2 made of ceramics, on which an IC 1 is mounted, and a cap 3 made of Kovar and previously plated with Au was sandwiched a solder 4 after the above-described working, and they were heated in a conveyor furnace to 300° C., whereby the solder 4 was melted and bonded to obtain an IC package 5. The section of the IC package after bonding is shown in FIG. 2.

Comparative Example

In contrast to the embodiment, an 80 wt. %-Au-20 wt. % Sn brazing material was produced and an IC package was produced. The method of producing the brazing material, method of working the brazing material and method of producing the IC package were the same as in the above embodiment.

Example of Experiment 1 (Measurement of Leak Rate)

The IC packages produced in the above-described embodiment and comparative example were subjected to a helium leak test, which is a fine leak test. The leak rates of the IC packages produced in the embodiment and comparative example were compared and examined. Incidentally, the helium leak test was conducted by applying the IC packages thus produced to a helium detector, causing the helium molecules in the interior to leak out through drawing a vacuum in the exterior of the IC packages, and counting the leaking helium molecules.

As a result, the leak rate (fraction defective) was 0.2% in the IC package produced with the use of the 80 wt. %-Au-20 wt. % Sn brazing material of the comparative example. In contrast to this, the leak rate of the IC package produced in the embodiment was 0.1% and it was confirmed that the leak rate is improved from that of the hermetic sealing method of comparative example.

Example of Experiment 2 (Observation of Microstructures of Bonded Portions)

Figure 3:
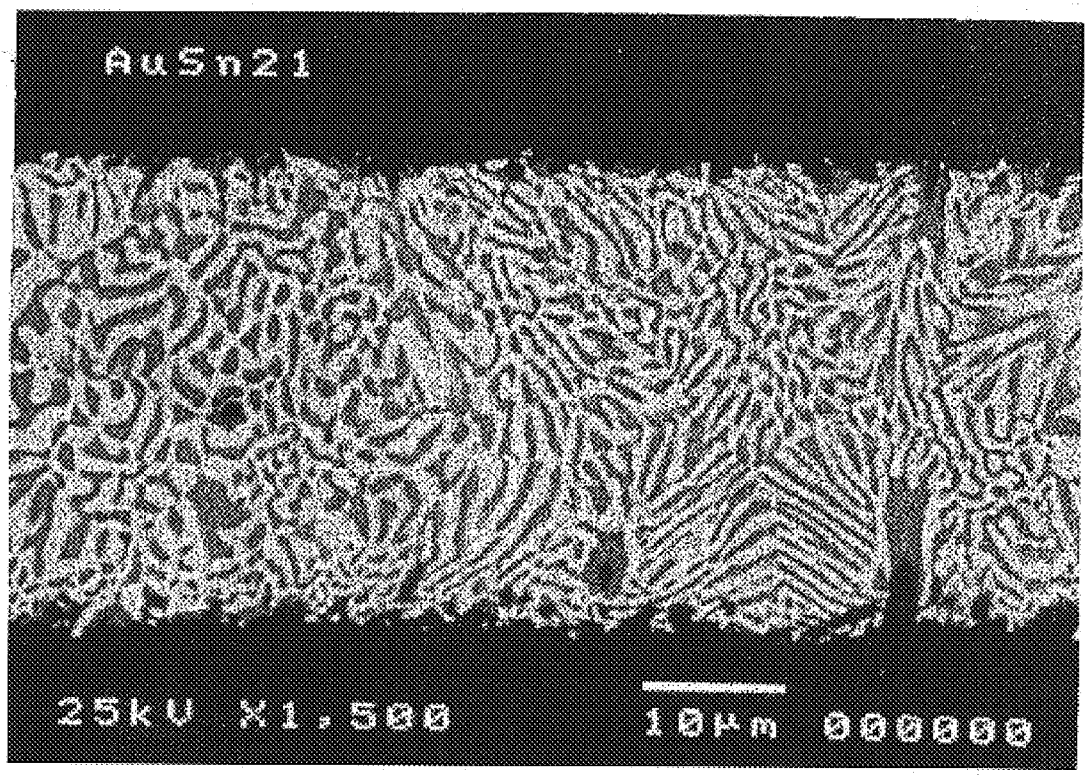
FIG. 3 shows a SEM photograph of the microstructure of a bonded portion in this embodiment.
Figure 4:
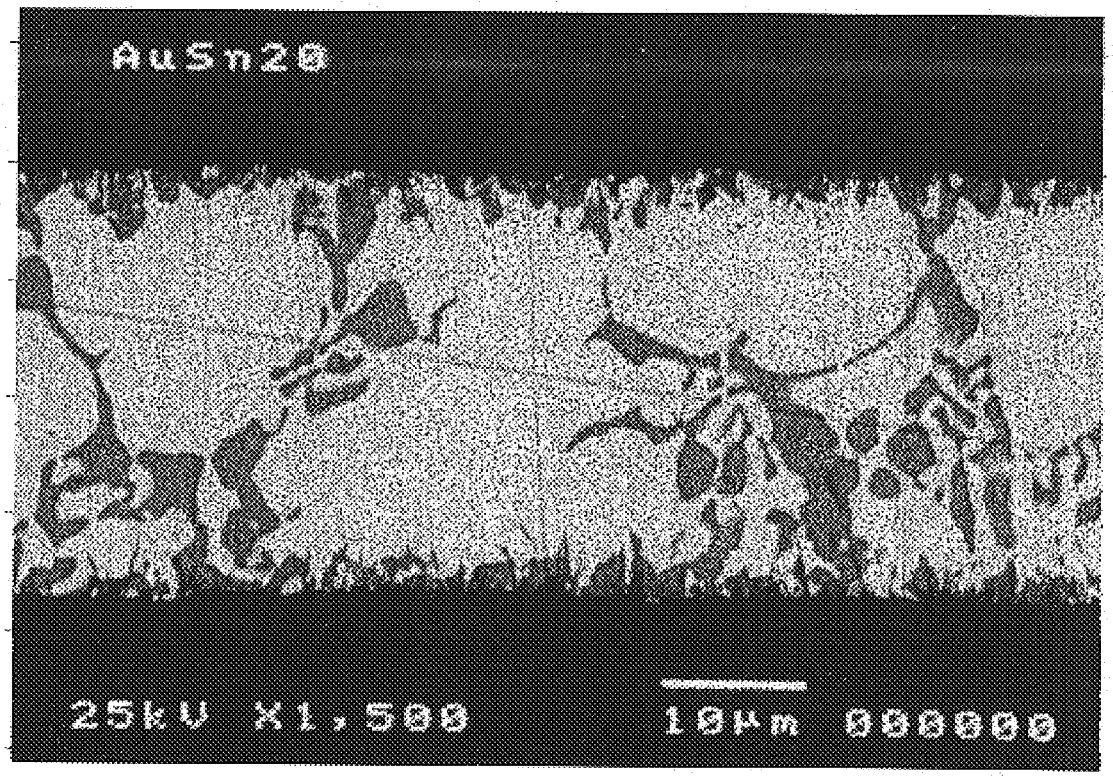
FIG. 4 shows a SEM photograph of the microstructure of a bonded portion in a comparative example.

Next, in order to investigate the microstructures (solder layers) of the IC packages produced in the embodiment and comparative example, the two bonded portions were observed under an SEM. The SEM photographs of the bonded portions of embodiment and comparative example are shown in FIGS. 3 and 4, respectively. From these SEM photographs it was ascertained that the bonded portion of the embodiment has a fine eutectic structure. On the other hand, it was ascertained that coarse Au rich phases (the white parts in FIG. 4) are present in the bonded portion of the comparative example. Because these Au rich phases have different sizes, it might be thought that they make the solder layer thickness during bonding nonuniform, though slightly, thereby causing leakage.

Industrial Applicability

As described above, the present invention makes it possible to hermetically seal electronic parts without generating an Au rich phase that makes the solder layer thickness after bonding non-uniform. This enables the leak rate of electronic parts to be lowered from levels of conventional ones, making it possible to efficiently manufacture electronic parts. Further in the future, the invention is adaptable for the miniaturization of electronic parts.

What is claimed is:

1. A method of hermetically sealing electronic parts, said method comprising bonding a base having semiconductor devices mounted thereon and a cap together via a solder, wherein said solder comprises from 78 wt % to less than 79.5 wt % Au, and a balance of Sn.

2. The method of claim 1, wherein said cap is plated with gold and with the use of said solder comprises from 78 wt % to less than 79 wt % Au, and a balance of Sn.

3. The method of claim 1, wherein the solder is adapted to form at least one solder layer of substantially uniform thickness.

4. The method of claim 1, wherein said solder, when bonded, comprises at least one Au—Sn alloy phase, wherein said Au—Sn alloy phase is substantially free of Au rich phases.

5. The method of claim 1, wherein said solder has a substantially uniform melting temperature.

6. The method of claim 1, wherein said solder, when bonded, is substantially free of Sn crystals.

7. The method of claim 1, wherein said solder comprises 78.5 wt % Au and 21.5 wt % Sn.

8. In a method of hermetically sealing an electronic part by bonding a base to a cap by a Au—Sn solder,
the improvement comprising
avoiding Au rich phases in the solder by using a solder consisting essentially of from 78 wt % to less than 79.5 wt % Au, and a balance of Sn.

9. The method of claim 8, wherein said cap is plated with gold,
wherein Au rich phases in the solder are avoided by using a solder comprises from 78 wt % to less than 79 wt % Au, and a balance of Sn.

* * * * *